(12) United States Patent
Chou et al.

(10) Patent No.: US 6,942,750 B2
(45) Date of Patent: Sep. 13, 2005

(54) LOW-TEMPERATURE PATTERNED WAFER BONDING WITH PHOTOSENSITIVE BENZOCYCLOBUTENE (BCB) AND 3D MEMS (MICROELECTROMECHANICAL SYSTEMS) STRUCTURE FABRICATION

(75) Inventors: Tsung-Kuan A. Chou, Ann Arbor, MI (US); Khalil Najafi, Ann Arbor, MI (US); Luis P. Bernal, Ann Arbor, MI (US); Peter D. Washabaugh, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 310 days.

(21) Appl. No.: 10/163,082

(22) Filed: Jun. 5, 2002

(65) Prior Publication Data

US 2002/0195673 A1 Dec. 26, 2002

Related U.S. Application Data

(60) Provisional application No. 60/297,223, filed on Jun. 8, 2001.

(51) Int. Cl.$^7$ .............................................. H01L 21/30
(52) U.S. Cl. ................... 156/272.2; 156/292; 438/456; 438/753
(58) Field of Search ........................... 156/272.2, 275.5, 156/275.7, 290, 292, 330; 438/455, 456, 689, 745, 753

(56) References Cited

U.S. PATENT DOCUMENTS

| | | | |
|---|---|---|---|
| 5,879,572 A | | 3/1999 | Folsom et al. |
| 5,919,606 A | * | 7/1999 | Kazlas et al. ............... 430/321 |
| 6,013,534 A | | 1/2000 | Mountain |
| 6,083,661 A | | 7/2000 | Oaks et al. |
| 6,103,552 A | | 8/2000 | Lin |
| 6,146,992 A | | 11/2000 | Lauterbach et al. |
| 6,184,284 B1 | | 2/2001 | Stokich, Jr. et al. |
| 6,477,901 B1 | * | 11/2002 | Tadigadapa et al. ... 73/861.352 |

OTHER PUBLICATIONS

M. Topper et al., "Embedding Technology—A Chip–First Approach Using BCB," 1997 Intl. Symposium on Advanced Packaging Materials, p. 11.
Z. Xiao et al., "Low Temperature Silicon Wafer–to–Wafer Bonding with Nickel Silicide,"J. Electrochem. Soc., vol. 145, No. 4, Apr. 1998, p. 1360–1362.
Brooks et al. "Low–temperature Electrostatic Silicon–to–Silicon Seals Using Sputtered Borosilicate Glass", J. Electrochem. Soc., vol. 119, No. 4, Apr. 1972, pp. 545–546.
R. Wolffenbuttel et al., "Low–Temperature Silicon Wafer–to–Wafer Bonding Using Gold at Eutectic Temperature," Sensors and Actuators, A43, N 1–3, May 1994, pp. 223–229.
F. Niklaus et al., "Void–Free Full Wafer Adhesive Bonding," Proc. MEMS 2000, pp. 247–252.
J. Chen et al., "A High–Resolution Silicon Monolithic Nozzle Array for Inkjet Printing", IEEE Trans. Electron Devices, vol. 44, No 9, Sep. 1997, pp. 1401–1409.
O. Tabata et al., "Anisotropic Etching of Silicon in TMAH Solutions," Sensors and Actuators, vol. A34, 1992, pp. 51–57.

(Continued)

*Primary Examiner*—John T. Haran
(74) *Attorney, Agent, or Firm*—Harness, Dickey & Pierce, P.L.C.

(57) ABSTRACT

A method of low-temperature (150–300° C.) patterned wafer bonding of complex 3D MEMS comprising providing a first pre-processed wafer having a first surface and a second pre-processed wafer having a second surface. Photosensitive benzocyclobutene (BCB) polymer is then applied to the first surface of the first wafer in a predetermined pattern to define a bonding layer. The second wafer is then bonded to the first wafer only along the bonding layer.

18 Claims, 13 Drawing Sheets

OTHER PUBLICATIONS

P.R. Scheeper et al., "A Review of Silicon Microphones," Sensors and Actuators, vol. A44, 1994, pp. 1–11.

Tsung–Kuan A. Chou et al., "3D MEMS Fabrication Using Low–Temperature Wafer Bonding With Benzocyclobutene (BCB)," Transducers '01 Eurosensors XV, 11th Int. Conf. on Solid–State Sensors and Actuators, Munich Germany, Jun. 10–14, 2001, pp. 1570–1573.

Tsung–Kuan A. Chou et al. "High–Density Micromachined Acoustic Ejector Array For Micro Propulsion," Transducers '01 Eurosensors XV, 11th Int. Conf. on Solid–State Sensors and Actuators, Munich Germany, Jun. 10–14, 2001, pp. 890–893.

D.J. Coe et al., "Micromachined Jets for Manipulation of Macro Flows," Solid–State Sensor and Actuator Workshop, Hilton Head, South Carolina, Jun. 13–16, 1994, pp. 243–247.

* cited by examiner

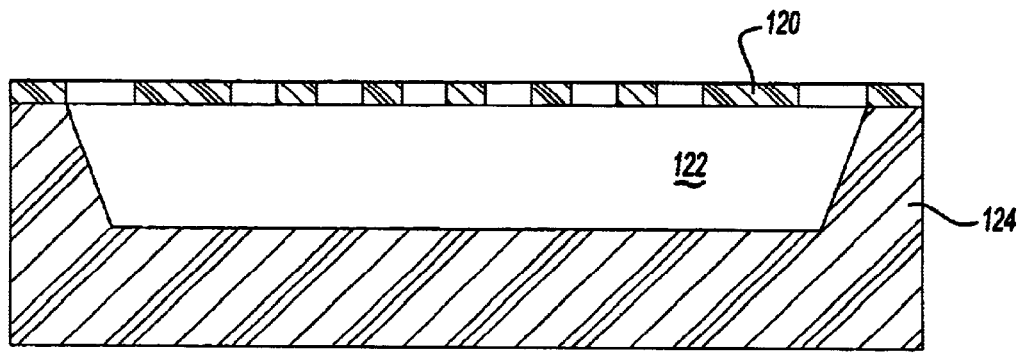
_Fig-7_
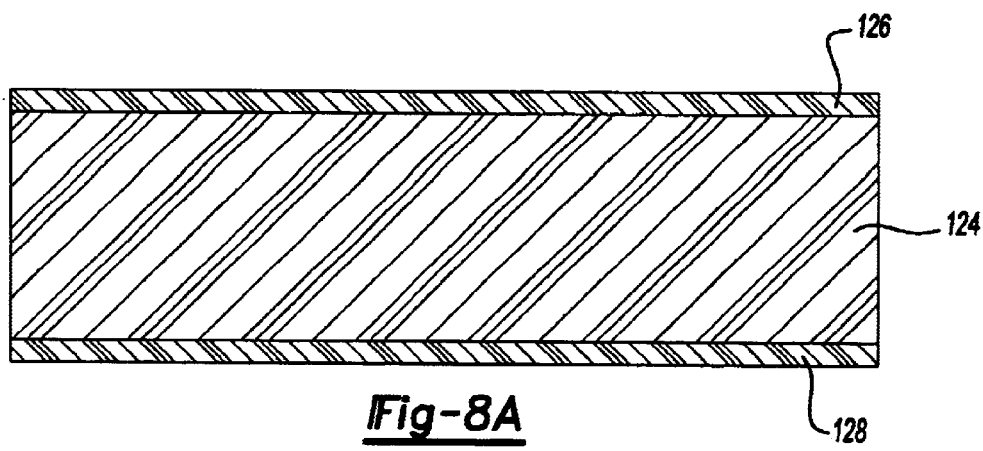
_Fig-8A_
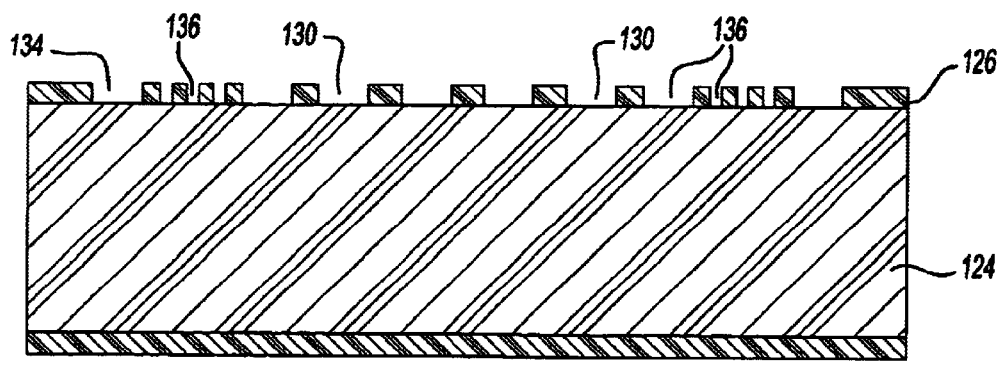
_Fig-8B_

LOW-TEMPERATURE PATTERNED WAFER BONDING WITH PHOTOSENSITIVE BENZOCYCLOBUTENE (BCB) AND 3D MEMS (MICROELECTROMECHANICAL SYSTEMS) STRUCTURE FABRICATION

CROSS-REFERENCE TO RELATED APPLICATIONS

This application claims the benefit of U.S. Provisional Application No. 60/297,223, filed on Jun. 8, 2001.

STATEMENT OF GOVERNMENTAL SUPPORT

This invention was made with Government support under Grant No. N00019-98-K-0111 awarded by the Defense Advanced Research Projects Agency. The Government has certain rights in this invention.

FIELD OF THE INVENTION

The present invention relates to fabrication of complex three-dimensional micro devices using patterned bonding and, more particularly, relates to a method of low-temperature precision patterned wafer bonding using photosensitive benzocyclobutene as a bonding media and/or an air gap spacer and its application to the manufacture of complex three-dimensional micro devices.

BACKGROUND OF THE INVENTION

Many emerging micro-electro-mechanical systems (MEMS) require the construction of complex three-dimensional (3D) microstructures. The manufacture of these microstructures typically utilizes wafer bonding, including Si—Si fusion, Si—Si anodic, and Si-glass anodic bonding. However, the high bonding temperatures associated with Si—Si fusion bonding, which may exceed 1000° C., prevent the use of materials, such as metals and integrated electronics, that can not withstand these temperatures. On the other hand, although the temperatures of Si-glass bonding are typically below 400° C., it is typically more difficult to precisely machine the glass compared to silicon bonding. Furthermore, Si—Si, glass-glass, and Si-metal bonding at low temperature is still difficult to achieve. Si—Si anodic bonding has been achieved by depositing a thick glass layer on a silicon wafer. However, the deposition of glass in this manner is usually too time consuming and costly for commercial production.

In an attempt to overcome these problems, Si—Si anodic bonding with an evaporated thick glass layer as the bonding media has been previously used. However, this process requires glass deposition, high voltages, and high electric fields, which may potentially damage integrated circuits nearby. Therefore, there exists a need in the relevant art to construct complex MEMS structures with a bonding method that is simple and compatible with integrated circuit processes.

Furthermore, within somewhat related industries, micro jets are increasingly needed in such applications as micro propulsion, macro flow control, and cooling. In this regard, it is known to form micro jets using actuators fabricated through MEMS fabrication techniques. These actuators are capable of producing an instantaneous air velocity up to several meters per second. However, in order to produce a higher jet velocity at ultrasonic actuating frequencies, a forced Helmholtz resonator must be implemented. This device produces a maximum air velocity when operating at its resonant frequency. Earlier attempts to utilize such resonators by MEMS technology have attempted to fabricate them using a silicon-glass bonded structure. While other attempts having included fabricating a nozzle into a silicon wafer and bonding a flexible membrane to the silicon wafer that when resonated will create a jet of air. Although such devices were actuated at ultrasonic frequencies and despite achieving high acoustic field and an oscillation of flow at the resonator orifice were observed, any appreciable air velocity could not be obtained.

Therefore, there exists a need in the relevant art to provide a method of fabricating three-dimensional MEMS at low-temperatures that can be used in sensors, actuators, micromachines, and other MEMS, including acoustic transducers. More particularly, there exists a need in the relevant art to provide a method of low-temperature, precision photolithography-patterned wafer bonding using photosensitive benzocyclobutene. Still further, there exists a need in the relevant art to overcome the disadvantages of the prior art.

SUMMARY OF THE INVENTION

According to the principles of the present invention, a method of low-temperature (150–300° C.) patterned wafer bonding of complex 3D MEMS using photosensitive BCB is provided. The method comprises providing a first pre-processed wafer having a first surface and a second pre-processed wafer having a second surface. Photosensitive benzocyclobutene (BCB) polymer is then applied to the first surface of the first wafer in a predetermined pattern to define a bonding layer. The second wafer is then bonded to the first wafer only along the bonding layer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 7 is a cross-sectional view of a cavity substrate having an integrated perforated electrode;

FIGS. 8(a)–(e) is a series of cross-sectional views illustrating the processing steps for preparing the cavity substrate having the integrated perforated electrode;

DETAILED DESCRIPTION OF THE PREFERRED EMBODIMENTS

The following description of the preferred embodiments is merely exemplary in nature and is in no way intended to limit the invention, its application, or uses.

According to the principles of the present invention, a wide variety of micro-electro-mechanical systems (MEMS) may be manufactured using a Si—Si patterned substrate or wafer bonding technique wherein photo-definable benzocyclobutene (BCB) polymer is used in conjunction with Deep Reactive Ion Etching (DRIE) and bulk micro-machining. The MEMS of the present invention consists of a thin diaphragm separated from a thick perforated electrode suspended over a back cavity. Generally, the MEMS is formed by bonding at least two pre-processed micro-machined silicon substrates, one supporting the diaphragm and the other supporting the sense/drive electrode. The three-dimensional micro-machining technique of the present invention can be used to manufacture acoustic transducers, such as pressure sensors, microphones, and micro pumps; and other complex machinery, such as acoustic resonators, micro mirrors, and the like. It should be readily understood that the same techniques described herein may be used to bond multiple wafers. However, in the interest of brevity only a two wafer/substrate embodiment will be described.

Briefly, by way of background, benzocyclobutene (BCB) is an epoxy-based polymer that was primarily developed as a low dielectric constant material for planarization, which is compatible with integrated electronics. After being fully cured, BCB shows low volume shrinkage and high resistance to most wet chemicals, thereby reducing structural stress. According to the present invention, photosensitive BCB can be spun onto a silicon substrate and then exposed and developed to define specific patterns using standard photolithography techniques. After pattern definition, BCB can be slightly precured or directly bonded with a companion substrate by applying pressure and temperature. As will be described below, the thickness of cured BCB may vary from less than 2 μm to more than 10 μm depending on the spin speed and the BCB specimen used. As will be described, the BCB-patterned substrate can then be bonded to another substrate with very high alignment capability at only selected regions. Thus, the two substrates are connected at only specific regions because the BCB is pre-patterned prior to bonding. Otherwise, the substrates do not touch in other unbonded regions, which is an important feature for most MEMS devices.

Figure 1:
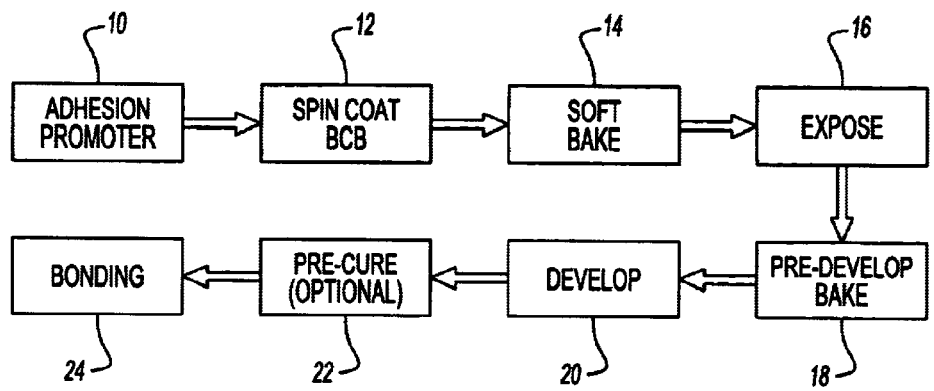
FIG. 1 is a flowchart illustrating the processing steps for preparing photosensitive BCB for bonding according to the principles of the present invention.
Figure 2:
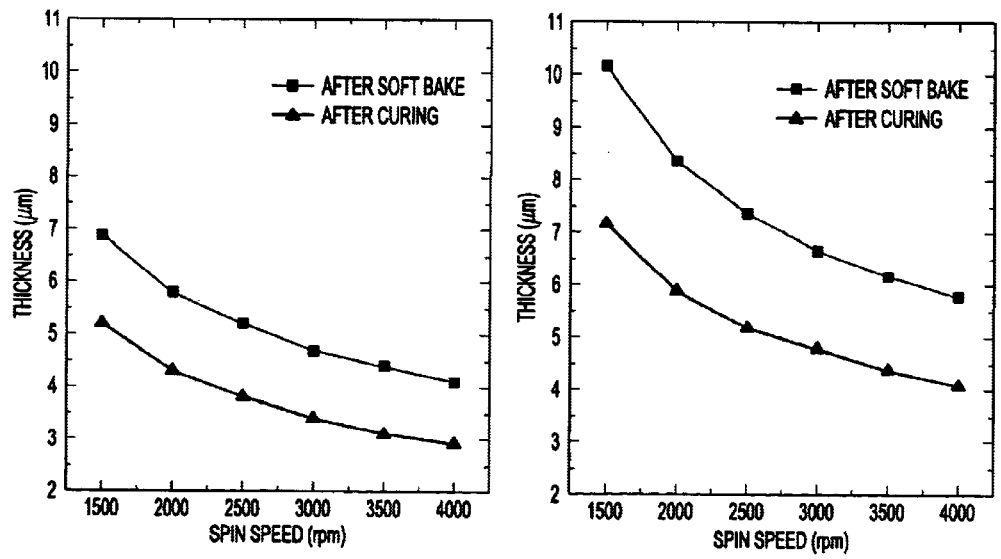
FIG. 2(a) is a graph illustrating the relationship between spin speed and BCB layer thickness for Cyclotene 4022.
FIG. 2(b) is a graph illustrating the relationship between spin speed and BCB layer thickness for Cyclotene 4024.

More particularly, the process steps for bonding are set forth in FIG. 1. At step 10, the BCB adhesion promoter is first spun on a substrate in order to enhance BCB adhesion. By way of example, the spinning of the BCB adhesion promoter may be applied at generally 3000 rpm. At step 12, photosensitive BCB is then spun on the substrate at a certain spin speed to achieve a specific thickness. The actual BCB thickness used depends on the spin speed and viscosity of the BCB specimen used. However, FIG. 2 illustrates a comparison of BCB thickness versus spin speed for CYCLOTENE from Dow Chemical, but the possible thicknesses and spin speeds should not be limited by the illustration shown. At step 14, the substrate is then soft baked on a hot plate before exposure. The soft baking time depends on the thickness and viscosity of BCB as well. At step 16, the BCB coated substrate is then exposed under specific wavelength light (usually UV light) with certain masking area for a period of time, depending on the film thickness. At step 18, a pre-develop bake is then performed on the hot plate in order to produce strong molecular cross-links at the exposed area. At step 20, the BCB is finally developed in developer solution. Following this step, the photo-exposed BCB will remain while the unexposed BCB is removed by the solution. As a result, negative patterns can be transferred directly from the optical mask. At optional step 22, an optional pre-cure process is illustrated, which, depending on the pre-curing temperature and time, can further reduce the void formation at bonding interface. However, as can be appreciated, this pre-curing step may not be required in all applications. The BCB-patterned substrate is then ready to be patterned bonded to another substrate. It should also be understood that other methods or techniques may be used to pattern the BCB or any other polymer on the substrate. By way of non-limiting limiting example, the adhesion promoter may be eliminated, the spin coating may be sprayed on, and the step of pre-develop baking may be performed using an oven or other heating device.

The second or companion substrate does not require any spun-on BCB. Adhesion promoter may be applied to the second substrate in order to enhance the bonding strength, but is not necessary. At step 24, bonding is performed by applying pressure at elevated temperatures for a predetermined amount of time. By way of non-limiting example, the temperature may be raised at a rate of 10° C. per minute to 250° C. and then held at that temperature and cured for 30 minutes.

Figure 3:
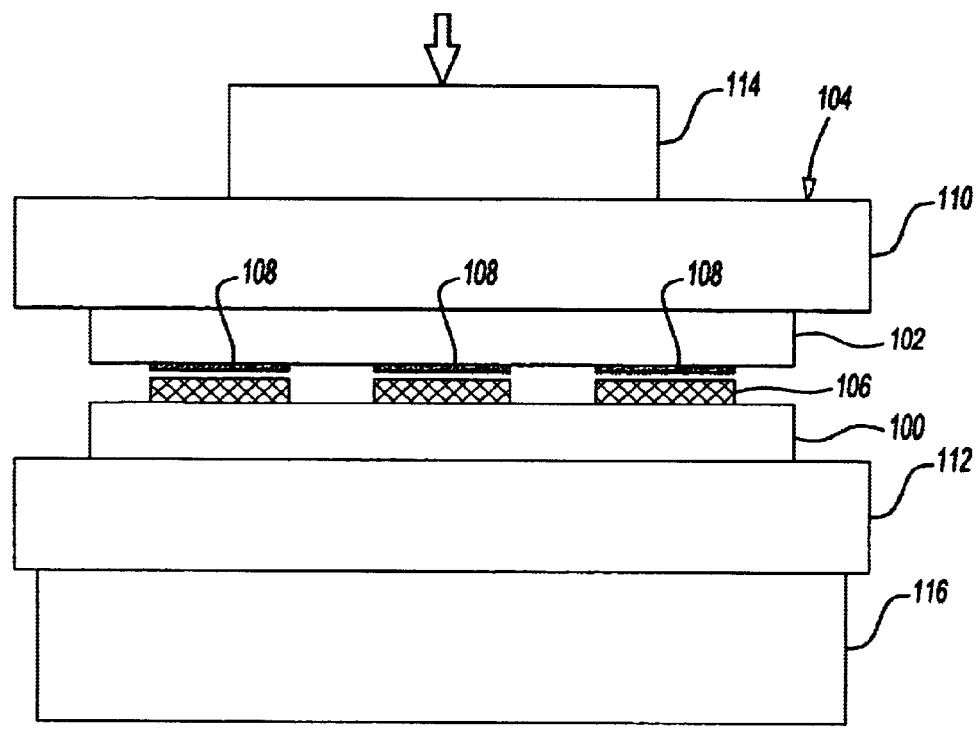
FIG. 3 is a schematic view illustrating a low-temperature precision patterned wafer bonding apparatus for use with photosensitive BCB according to the present invention.

With particular reference to FIG. 3, the bonding setup is further discussed. A first substrate 100 and a second substrate 102 are first aligned for patterned precision bond by an alignment machine 104. First substrate 100 includes a number of BCB layers 106 formed thereon according to the previously described process steps. First substrate 100 and second substrate 102 are aligned such that a bond is created only at a contact region 108 that is adjacent BCB layer 106. Downward pressure is applied to a top substrate chuck 110 so as to bring second substrate 102 in contact with first substrate 100, which is positioned on opposing bottom substrate chuck 112. This downward pressure serves to eliminate any air gaps at the BCB bonding interface at contact regions 108. An elevated temperature (e.g. 250 degree C.) is used to cure BCB layer 106 such that a strong bond can be achieved at contact region. Such elevated temperature is achieved through a pair of heaters 114 and 116.

Bonding quality depends on the pre-cure condition, bonding pressure, curing temperature and time. Different applications require different levels of bonding quality. Some applications require low stress induction during bonding, especially for sensitive MEMS devices. By decreasing bonding pressure, the possibility in damaging the microstructures and deforming the BCB patterns during this process is minimized.

In a series of tests, BCB patterned substrates were thermal-compressively bonded to a bare silicon substrate. The results showed approximately 30 MPa of tensile stress, which is lower than that induced by other adhesive bonding materials. The bonding quality was found to depend on the pre-cure condition, bonding pressure, curing temperature, and time. Since many MEMS devices are very sensitive to bonding pressure, which may induce unwanted stress on the structures, it is preferable to use the lowest compressive pressure required for good bonding.

Simply to inspect the bonding quality, bonded substrates 100 and 102 were forced apart for observation. It was found that substrates bonded with an applied pressure of 150 kPa at a temperature of 25° C. for 30 minutes had more than 90% of patterned BCB layer 106 transferred from first substrate 100 to second substrate 102, while the original pattern also remained on first substrate 100 as well.

Figure 4:
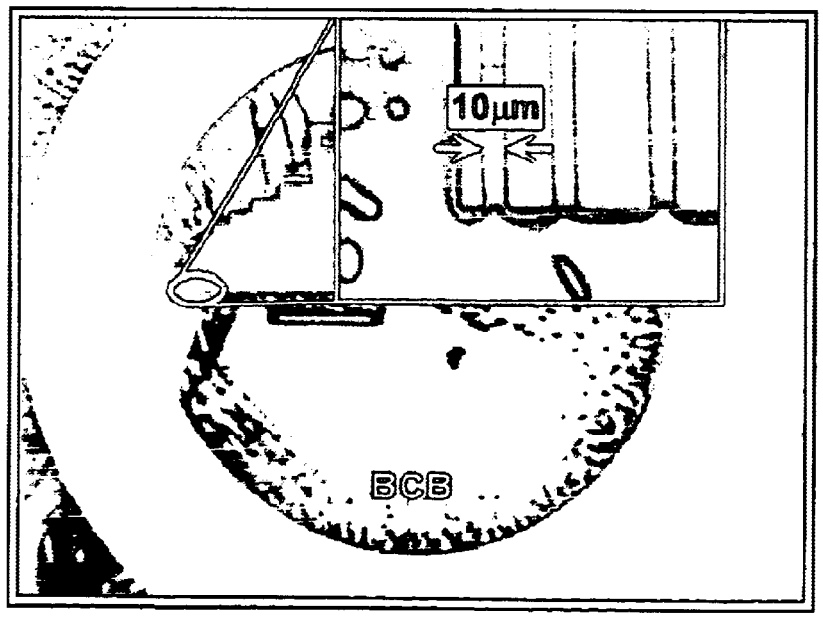
FIG. 4 is an enlarged photograph illustrating the BCB pattern transference after bonding.
Figure 5:
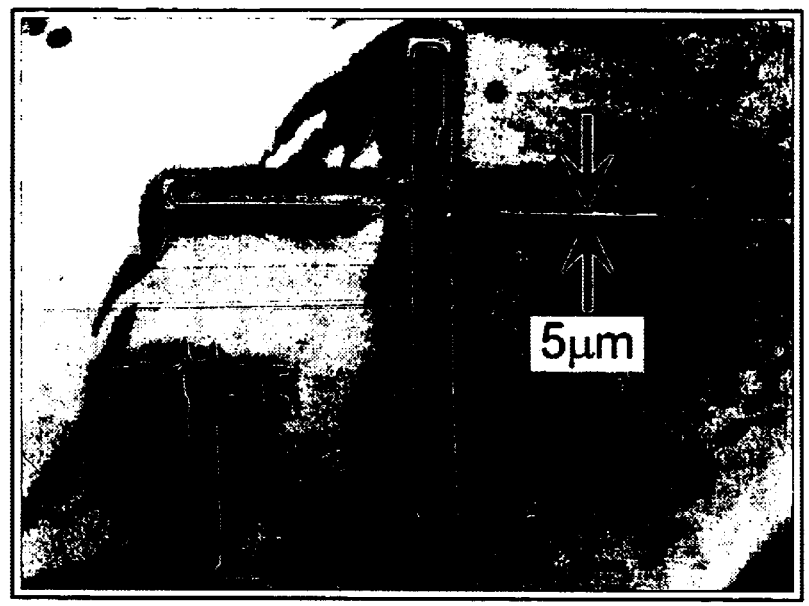
FIG. 5 is another enlarged photograph illustrating the BCB pattern transference after bonding.

FIGS. 4 and 5 illustrate the patterns transferred onto second substrate 102 after bonding. It was also found that patterned BCB layer 106 does not produce appreciable distortion in feature size after bonding. That is, a 10 $\mu$m wide and a 5 $\mu$m thick BCB pattern retains its shape after bonding.

Figure 6:
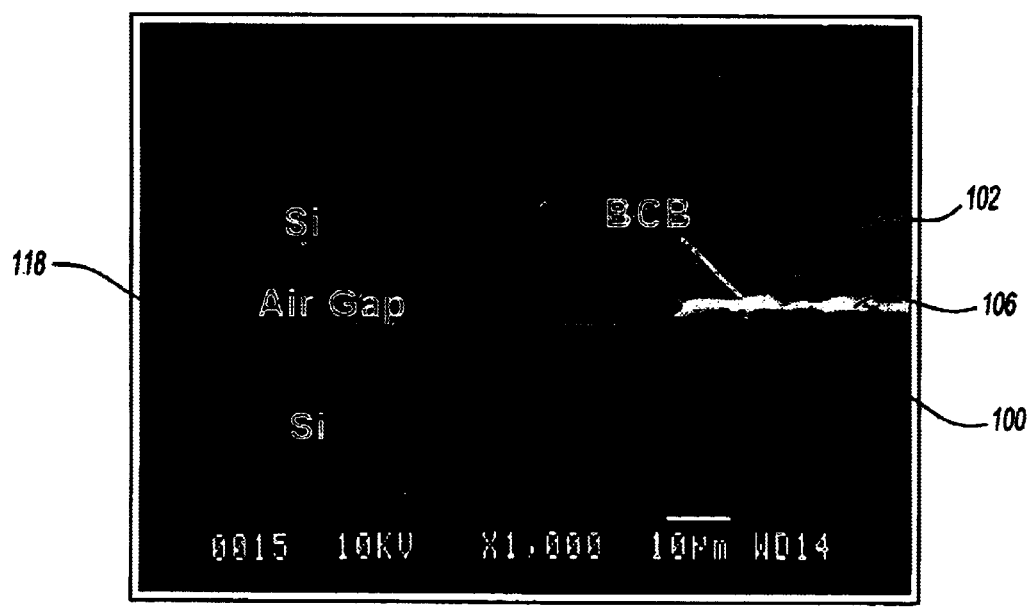
FIG. 6 is a cross-sectional photograph of a BCB bonded wafer pair illustrating the air gap and bond interference.

Referring now to FIG. 6, BCB layer 106 can serve as an air gap spacer, as well as the bonding media, between substrates 100 and 102 to define an air gap 118. The size of air gap 118 is determined by the thickness of cured BCB pattern 106 and the bonding conditions, such as pressure and temperature. Therefore, one can easily change the distance of air gap 118 by changing the thickness of spun on BCB layer 106, without compromising the structural uniformity. By way of example, it has been found that the variation in air gap 118 is generally less than 5% across a 4" silicon substrate. This method in forming an air gap is much simpler than conventional methods in MEMS fabrication, which usually require time-consuming deposition of a sacrificial material, such as silicon dioxide and polycrystalline silicon deposited by LPCVD (low pressure chemical vapor deposition). The thicknesses of these conventional spacers are often limited to a few micrometers. As a result, the bonding technique of the present invention has the capacity to easily and conveniently produce microstructures, such as capacitive sensors and actuators. In addition, the bonding interface of BCB pattern 106 is be void-free, since the BCB material does not evolve volatile product during curing. Moreover, since BCB does not absorb water after curing, this method of the present invention can be used to isolate structures at the non-bonded area from the soaking water/chemical or even hermetic-sealed bond.

In summary, bonding with BCB provides the following advantages: 1) low-temperature and low stress bonding, 2) uniform air gap spacing, 3) variable thickness, and 4) high chemical resistance. It can be used not only as the bonding media but also as the spacer between two structures with sufficient strength and uniformity. Furthermore, it can be used as a protective or electrically insulating layer to insulate specific regions from the harsh post bonding process.

Perforated Electrode with Integrated Back Cavity

Capacitive sensors and actuators often require two electrodes for their operation. One of these electrodes often needs to be perforated to reduce dampening. According to the principles of the present invention, a perforated electrode and a back cavity is formed for this purpose. As seen in FIG. 7, a perforated electrode 120 is formed having a back cavity 122 on a single silicon substrate 124. In order to construct such structure, a combination of Deep Reactive Ion Etched (DRIE) and wet Tetramethyl Ammonium Hydroxide (TMAH) or KOH anisotropic etch on silicon is used. Ethylene Diamine Pyrochatechol (EDP) has been found to be less preferred due its saturation problem, which will be described below.

Highly boron-doped silicon substrate is not significantly etched by EDP, TMAH, or KOH, when the boron concentration is higher than approximately $1 \times 10^{20}(1/cm^3)$. However, the (100) plane in the silicon substrate has an etch rate of approximately 30–50 times faster than that of the (111) plane. Therefore, when a deep-boron-diffused (100) plane of silicon is perpendicularly etched through by DRIE, the exposed lightly doped silicon can be further etched anisotropically by EDP, TMAH, or KOH with selectivity between (100) and (111) planes.

Figure 8C:
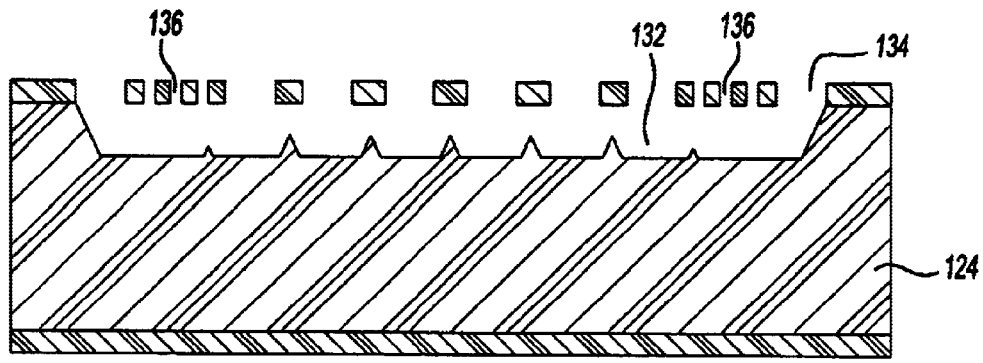
Figure 8D:
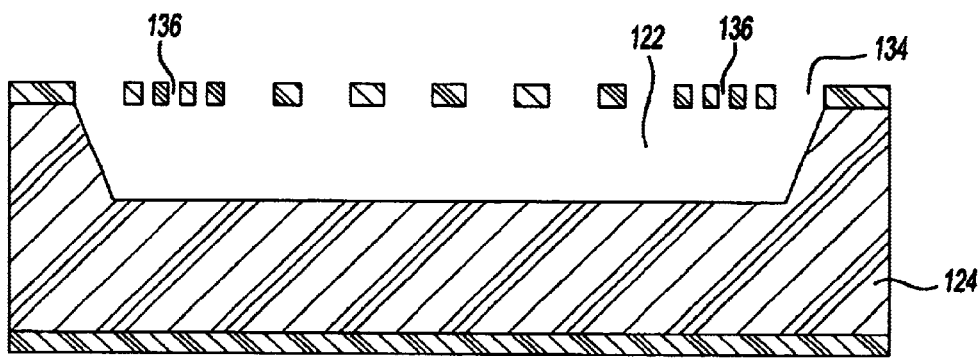
Figure 8E:
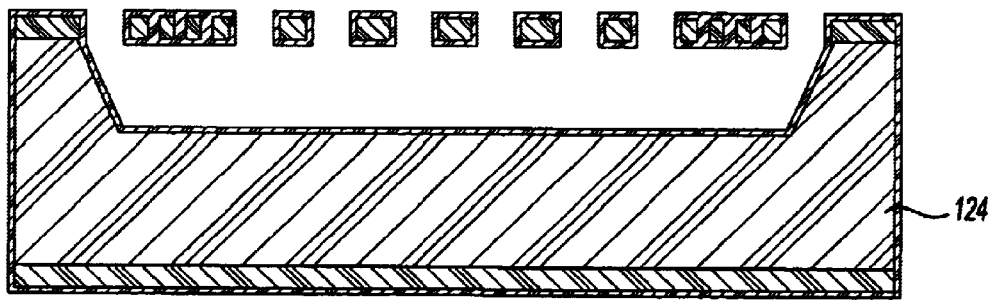
Figure 9:
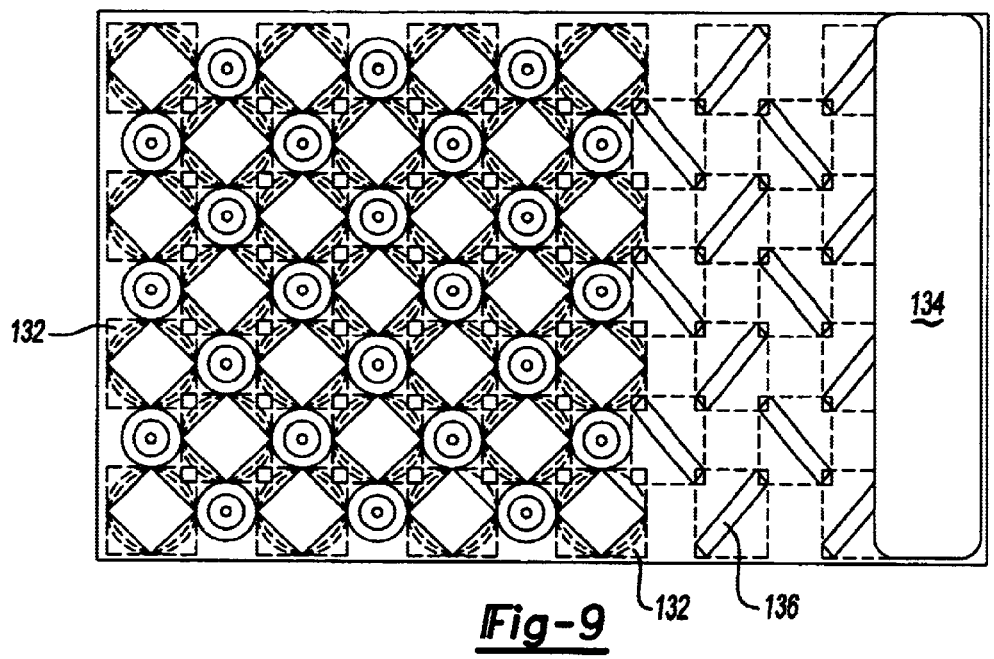
FIG. 9 is a plan view, with portions hidden, of the cavity substrate and perforated electrode.

More particularly, with reference to FIGS. 8(a)–(e), silicon substrate 124 is first boron-diffused at the surface portions 126 and 128 (FIG. 8(a)). Then, a plurality of perforations 130 are etched into boron-diffused silicon surface portion 126 by DRIE (FIG. 8(b)). In order to prevent perforations 130 from converging with deeper etch, square openings rotated by 45° from the <110> direction are used (FIG. 9). Consequently, undercut etch will create an initial opening 132 underneath boron-diffused silicon surface portion 126, as illustrated by the dashed square pattern in FIGS. 8(c) and 9. With initial openings 132 overlapping one another, further etch will clear all lightly doped silicon between perforations 130 (circular pattern) and, thus, form a continuous back cavity 122 (FIG. 8(d)).

In the event that silicon substrate 124 includes exit openings or throats 134 located at the edges of back cavity 122 and aligned to the [110] directions, anisotropic wet etching may cause exit openings 134 to converge as etch goes deeper. This may result in exit openings 134 being separate from back cavity 122. To prevent such exclusion, cross-aligned slit openings 136 may be disposed between exit openings 134 and perforations 130. Slit openings 136 can be as narrow as 1–2 $\mu$m, which can be sealed after cavity formation by conformal deposition of a material layer (see FIG. 8(e)), such as LPCVD nitride, oxide, or polycrystalline silicon. Similar to the etching mechanism used for perforations 130, undercut etching will also form continuous back cavity 122 to the outer edges of exit openings 134. It should be understood that if it is desirable that back cavity 122 be totally sealed as a reservoir with only exit openings 134, then perforations 130 may simply be replaced with cross-aligned slit openings 136 to form the same buried cavity with TMAH etch. Subsequently, slit openings 136 may be sealed by conformal deposition of a material layer.

It has been found that EDP, TMAH, and KOH may be used for anisotropic wet etching for silicon bulk micromachining. However, because KOH is not compatible with the integrated circuits process and EDP can suffer saturation problem during etching in the present described structure, TMAH has been found to be capable of creating a smoother profile in back cavity 122. It should be understood that it is possible to perform undercut etching without rotation of perforations by increasing the DRIE depth. However, this may result in excessive undercut etch at the outer edges of back cavity 122. This may reduce design flexibility and/or compromise the device performance.

Figure 10:
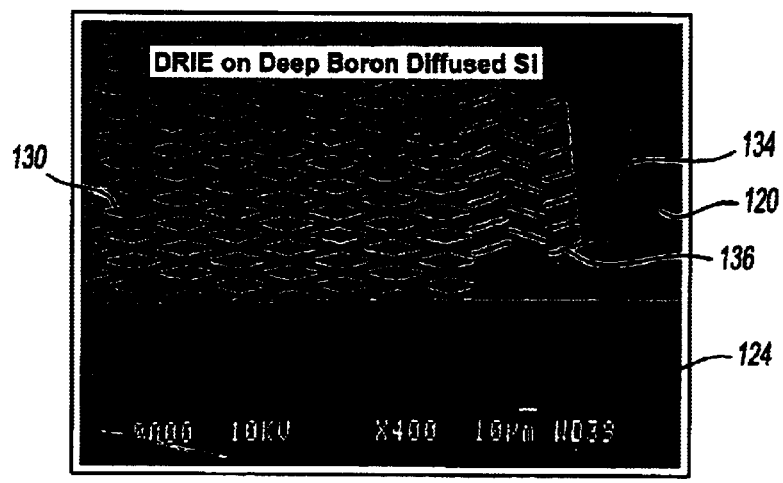
FIG. 10 is an enlarged photograph illustrating the perforated electrode following DRIE processing.
Figure 11A:
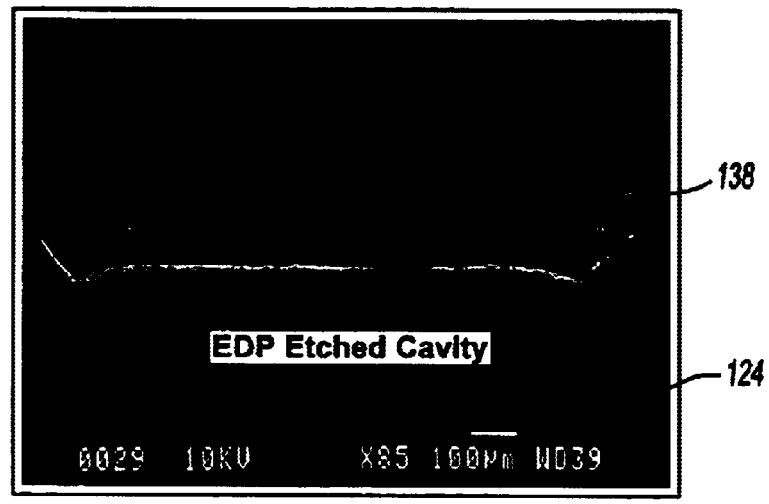
FIG. 11(a) is an enlarged photograph illustrating the results of the cavity following ethylene diamine pyrochatechol etching.
Figure 11B:
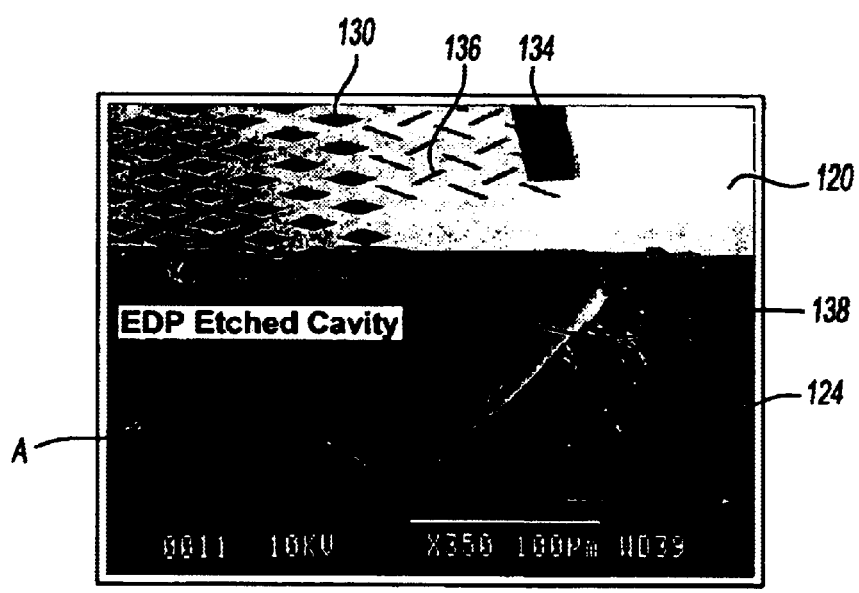
FIG. 11(b) is a further enlarged photograph illustrating the rough surfaces of the cavity following ethylene diamine pyrochatechol etching.

To demonstrate this technique, as seen in FIG. 10, a (100) silicon substrate 124 is first deep-boron diffused to create an electrode or back plate 120 having thickness of approximately 15 $\mu$m. An area below perforations 130 and exit openings 134 is then vertically etched down with DRIE by approximately 35 $\mu$m. It should be appreciated that exit openings 134 are aligned to the major and minor flats of silicon substrate 124, i.e. parallel to the [110] directions. Cross-aligned slit openings 136 are disposed between perforations 130 and exit opening 134. As best seen in FIGS. 11(*a*) and (*b*), it was determined that perforated electrode 120 could be completely released from silicon substrate 124 using EDP etch to define continuous back cavity 122 that extends to inclined sides 138. However, as can be seen in FIG. 11(*b*), the bottom profile of back cavity 122 is rough (see arrow A). This roughness results from the EDP solution being trapped in back cavity 122 during etching. Since EDP saturates quickly, the etch rate becomes irregular within back cavity 122, thereby resulting in rough etching profile. As etching going deeper, the result becomes even worse.

Figure 12:
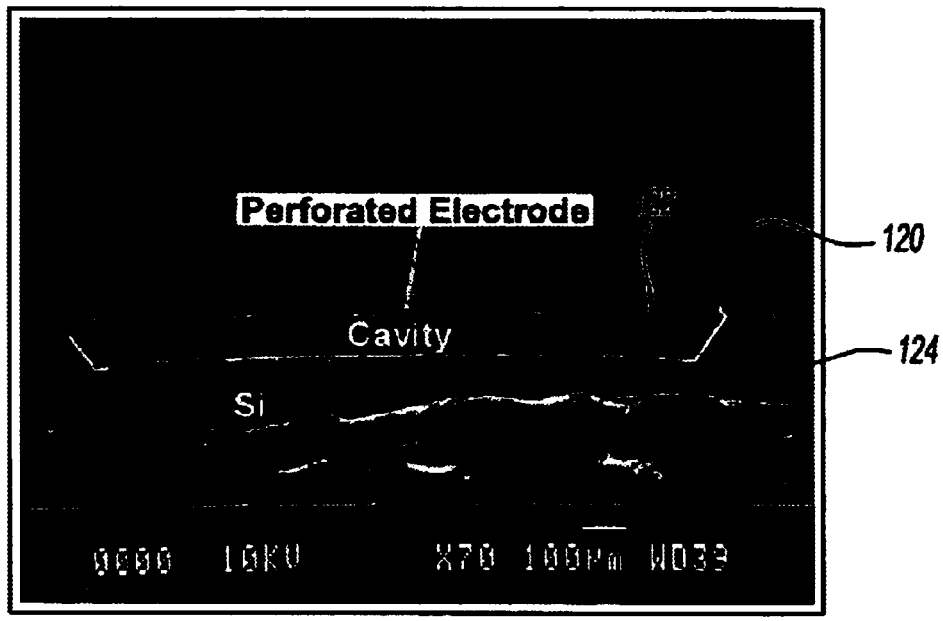
FIG. 12 is an enlarged photograph illustrating the results of the cavity following tetramethyl ammonium hydroxide etching.
Figure 13:
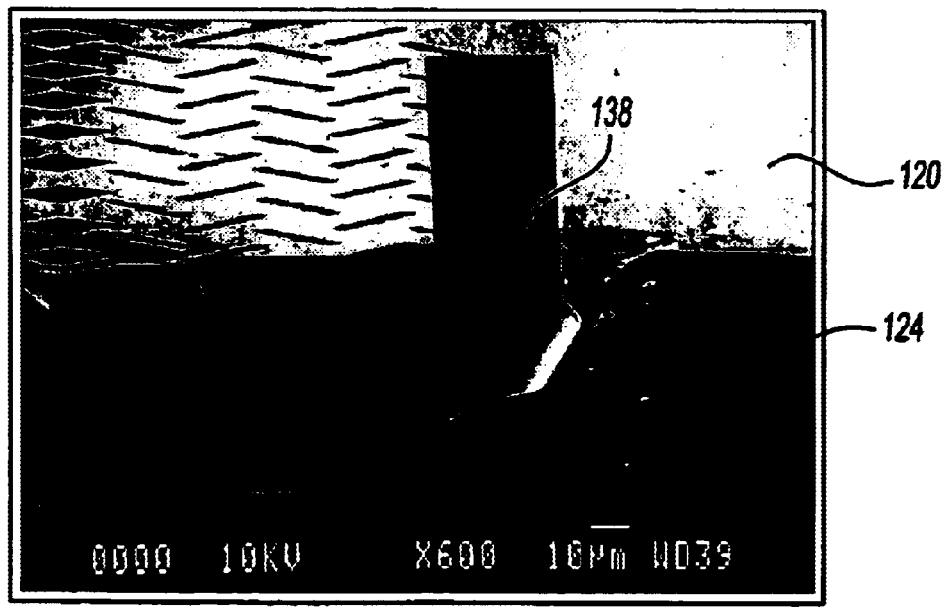
FIG. 13 is a further enlarged photograph illustrating the smooth surfaces of the cavity following tetramethyl ammonium hydroxide etching.

On the other hand, it has been found that TMAH is capable of etching a large volume cavity without suffering the saturation problem of EDP. FIGS. 12 and 13 illustrates the result of silicon substrate 124 being etched in 10% TMAH solution at 85° C. for 1.5 hours. The final depth of back cavity 122 in this case is approximately 120 $\mu$m. It can be clearly seen that perforated electrode 120 is totally released and suspended above back cavity 122. Etched back cavity 122 exhibits a much smoother profile than that etched by EDP (FIG. 11(*b*)). As best seen in FIG. 13, one can create different micro structures by combination of different perforations, DRIE depth, and TMAH etch time.

3-D MEMS Fabrication

Figure 14:
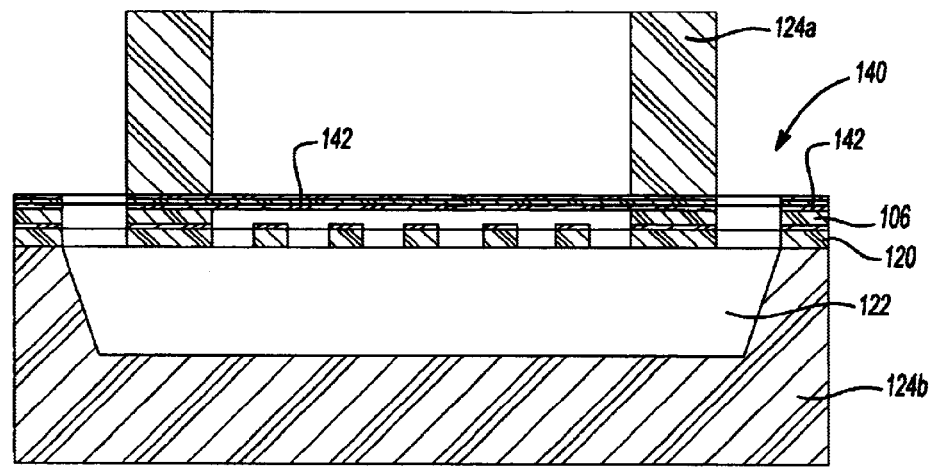
FIG. 14 is a cross-section view of a MEMS device according to the principles of the present invention.
Figure 15:
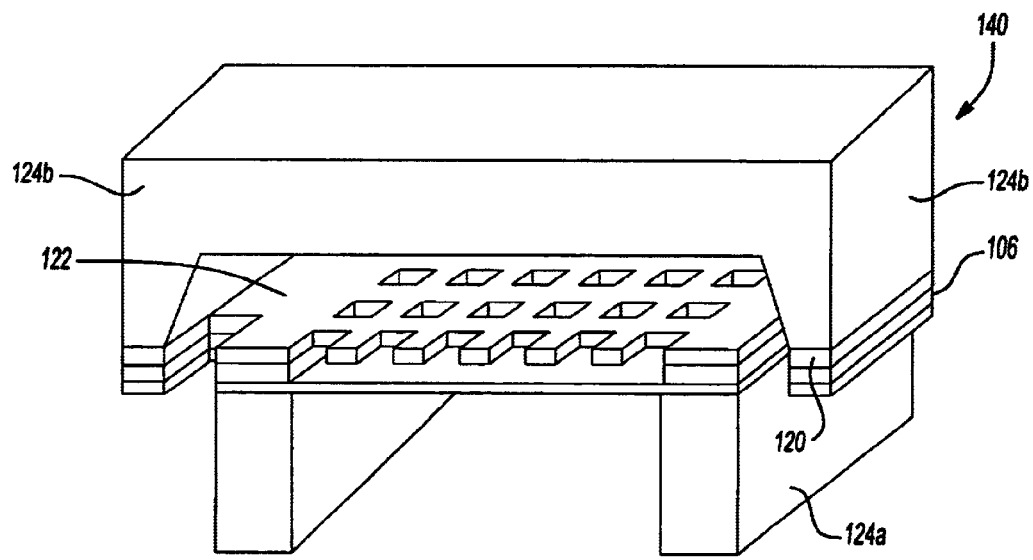
FIG. 15 is a perspective view of the MEMS device illustrated in FIG. 14.

With reference to FIGS. 14 and 15, a batch-processed, three-dimensional MEMS device 140 according to the principles of the present invention is illustrated. MEMS device 140 includes a thin diaphragm 142 separated from perforated electrode 120 suspended over back cavity 122. Diaphragm 142 is fabricated on a first substrate or diaphragm wafer 124*a* and perforated electrode 120 with back cavity 122 is fabricated on a second substrate or cavity wafer 124*b* in accordance with the process described herein. That is, MEMS device 140 is constructed by bonding two pre-processed/pre-machined/pre-formed wafers 124*a*, 124*b* using the photosensitive, patterned BCB layer 106 disposed therebetween. Such 3D micromachining technique may be used to build most acoustic transducers, such as microphone, pressure sensors, and micro pumps, and other complex machineries, such as acoustic ejectors, micro mirrors, and the like. As set forth above, the method of the present invention may also be used for fabricating multi-layer MEMS having more than two layers. Furthermore, the substrates may be made from a wide variety of materials, such as silicon, glass, ceramics, metals, and the like. This process, thus, is very useful in fabricating microjets, as illustrated in the attached figures.

With reference to FIGS. 16(*a*)–(*p*), the process for fabricating MEMS device 140 is illustrated. Prior to bonding, cavity wafer 124*b* and diaphragm wafer 124*a* are preformed. With particular reference to FIG. 16(*b*), cavity wafer 124*b* is first deep-boron diffused on sides 144 and 146 for approximately 15 $\mu$m. The residual stress of this deep-boron diffused silicon is approximately 20–30 MPa. As seen in FIG. 16(*c*), cavity wafer 124*b* is then deposited with LPCVD silicon dioxide (approximately 2000 Å) or oxide (approximately 1000 Å) / nitride (approximately 500 Å) bilayer to form a dielectric layer 148. Dielectric layer 148 can be used as both an electrical insulator and a TMAH etch stop. By adjusting the thickness of dielectric layer 148, the final residual stress of perforated electrode 120, which is formed by boron-diffused silicon/oxide/nitride, can be tuned to required values.

Referring to FIG. 16(*d*), electrode perforations 130 and exit openings 134 are then etched by BHF and DRIE through the oxide and boron-diffused silicon. Metallization of perforated electrode 120 is done at backside of cavity wafer 124*b*. As seen in FIG. 16(*e*), perforated electrode 120 and back cavity 122 are finally fabricated by anisotropic wet etching in 10% TMAH solution at 85° C. for 1 hour 15 min. Cavity wafer 124*b* is then ready to be bonded to diaphragm wafer 124*a*.

As seen in FIG. 16(*f*), diaphragm wafer 124*a* is first thermally oxidized to form approximately 1 $\mu$m thick silicon dioxide layer 150. Dioxide layer 150 serves as etch stop when diaphragm wafer 124*a* is released by DRIE. Diaphragm wafer 124*a* then deposited with a LPCVD silicon nitride layer 152 (approximately 175 nm), an oxide layer 154 (approximately 250 nm), and a polycrystalline silicon layer 156 (approximately 1.4 $\mu$m) as shown in FIG. 16(*g*). Polycrystalline silicon layer 156 is then boron-doped and patterned as electrically conductive membrane (FIG. 16(*h*)). Silicon dioxide 158 (approximately 250 nm) and nitride 160 (approximately 175 nm) are then deposited to cap polycrystalline silicon layer 156 (FIG. 16(*i*)).

The resulting average residual stress of oxide/nitride capped polycrystalline silicon layer 156 is approximately 60 MPa. It is possible to tune the membrane stress and stiffness by changing the combination thickness of polycrystalline silicon layer 156, oxide layer 154, and nitride 160. Etching of contact via 162 on polycrystalline silicon layer 156 is then completed and followed by metallization (FIG. 16(*j*)). Nitride/oxide/nitride etch on diaphragm wafer 124*a* and backside film removal is then completed (FIG. 16(*k*)).

Photosensitive BCB layer 106, preferably Dow Cyclotene 4024, is then spun and patterned on diaphragm wafer 124*a* according to a predetermined pattern (FIG. 16(*l*)). Cavity wafer 124*b* is finally aligned and locally bonded to diaphragm wafer 124*a* under approximately a pressure of about 150 kPa at 250° C. for 30 min according to the method described in detail herein (FIG. 16(*m*)). It is important to note that patterned BCB layer 106 is used to not only bond wafers 124*a* and 124*b*, but also to serve as an air gap spacer between perforated electrode 120 and diaphragm 142. In this specific case, the thickness of BCB layer 106 is approximately 5.5 $\mu$m. To change air gap 118, one can simply change the thickness of BCB layer 106.

The substrate then released by DRIE from diaphragm wafer 124*a* as shown in FIG. 16(*n*). Since the dioxide layer 150 (approximately 1 $\mu$m) is highly resistive to DRIE, it prevents attack or degradation of layers 152, 154, 156, 158, and 160. Dioxide layer 150 is then removed by BHF (FIG. 16*o*). Finally, diaphragm contact opening 162, through wafer hole 164, and device separation are formed simultaneously by DRIE in cavity wafer 124*b* (FIG. 16*p*). It should be noted that individual devices/chips do not require extra dicing process for separation. Accordingly, this makes it possible the devices/chips can be made having any shape without using a cutting tool.

The key element of the technology is the use of BCB for low-temperature substrate bonding. This allows the substrate bonding to have low impact on the critical residual stresses in either of the bonded substrates. Meanwhile, BCB serves as the air gap spacer (and/or insulating dielectric layer) in the structure for capacitive transducers. Silicon DRIE and bulk micro machining are also used to produce the final three-dimensional structure. A high-sensitivity capacitive pressure sensor/microphone has been fabricated based on the proposed technology. This technology has demonstrated a robust and simple process in fabricating complex MEMS structures for various applications.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of low-temperature bonding an apparatus, said method comprising:
    providing a first substrate having a first surface, said first surface having a first portion of a MEMS device formed thereon;
    providing a second substrate having a second surface, said second surface having a second portion of said MEMS device formed thereon;
    applying photosensitive benzocyclobutene to said first surface of said first substrate in a predetermined pattern to define a bonding layer, an area of said bonding layer being less than an area of said first surface;
    positioning said second substrate in contact with said bonding layer on said first substrate to create a bond between said first substrate and said second substrate at said bonding layer at a temperature between about 50° C. and about 300° C. to form a bonded unit, said positioning of said second substrate in contact with said first substrate further joins said first portion of said MEMS device to said second portion of said MEMS device; and
    etching said bonded unit to further form said MEMS device.

2. The method according to claim 1 wherein said applying photosensitive benzocyclobutene to said first surface of said first substrate in said predetermined pattern to define said bonding layer comprises:
    applying said photosensitive benzocyclobutene to said first substrate;
    exposing at least a portion of said photosensitive benzocyclobutene to a predetermined wavelength of light; and
    removing the remaining unexposed portion of said photosensitive benzocyclobutene to define said bonding layer.

3. The method according to claim 2, further comprising:
    applying an adhesion promoter to said first substrate prior to said applying photosensitive benzocyclobutene to said first substrate to enhance said bond between said first substrate and said second substrate.

4. The method according to claim 2, further comprising:
    baking said photosensitive benzocyclobutene on said first substrate prior to said exposing at least a portion of said photosensitive benzocyclobutene to said predetermined wavelength of light.

5. The method according to claim 2, further comprising:
    baking said photosensitive benzocyclobutene on said first substrate following the said exposing at least a portion of said photosensitive benzocyclobutene to said predetermined wavelength of light to produce a reliable molecular cross-link at said bonding layer.

6. The method according to claim 2 wherein said applying photosensitive benzocyclobutene to said first substrate includes spinning said photosensitive benzocyclobutene upon said first substrate at a predetermined spin rate to achieve a predetermined thickness of said bonding layer.

7. The method according to claim 1 wherein said first substrate is a boron-doped silicon and said providing said first substrate having said first surface, said first surface having said first portion of said MEMS device formed thereon comprises:
    deep reactive ion etching a plurality of perforations through said first surface of said first substrate; and
    wet tetramethyl ammonium hydroxide anisotropic etching said first substrate below said plurality of perforations to produce a generally uniform cavity within said first substrate such that said first surface layer generally spans said cavity and defines said first portion of said MEMS device.

8. The method according to claim 1 wherein said applying photosensitive benzocyclobutene to said first surface of said first substrate in said predetermined pattern to define said bonding layer comprises:
    providing a stencil mask having an opening, a shape of said opening corresponding to said predetermined pattern;
    positioning said stencil mask adjacent said first surface of said first substrate; and
    applying photosensitive benzocyclobutene to said first surface of said first substrate through said opening of said stencil mask such that said photosensitive benzocyclobutene defines said bonding layer.

9. The method according to claim 1 wherein said second substrate is a boron-doped silicon and said providing said second substrate having said second surface, said second surface having said second portion of said MEMS device formed thereon comprises:
    thermally oxidizing said second substrate to form a silicon dioxide layer;
    depositing a silicon nitride layer, an oxide layer and a polycrystalline silicon layer upon said second substrate;
    boron doping said polycrystalline silicon layer to provide electrical conductivity; and
    etching said least one of said silicon nitride layer, said oxide layer, and said polycrystalline silicon layer to define said second portion of said MEMS device.

10. A method of low-temperature bonding an apparatus, said method comprising:
    providing a first substrate having a first surface, said first surface having a first portion of a MEMS device formed thereon;
    providing a second substrate having a second surface, said second surface having a second portion of said MEMS device formed thereon;
    applying photosensitive benzocyclobutene to said first surface of said first substrate in a predetermined pattern to define a bonding layer, an area of said bonding layer being less than an area of said first surface;
    positioning said second substrate in contact with said bonding layer on said first substrate to create a bond between said first substrate and said second substrate at said bonding layer at a temperature between about 150° C. and about 300° C. to form a bonded unit, said positioning of said second substrate in contact with said first substrate further joins said first portion of said MEMS device to said second portion of said MEMS device; and
    deep reactive ion etching said bonded unit to further form said MEMS device.

11. The method according to claim 10 wherein said applying photosensitive benzocyclobutene to said first surface of said first substrate in said predetermined pattern to define said bonding layer comprises:
- applying said photosensitive benzocyclobutene to said first substrate;
- exposing at least a portion of said photosensitive benzocyclobutene to a predetermined wavelength of light; and
- removing the remaining unexposed portion of said photosensitive benzocyclobutene to define said bonding layer.

12. The method according to claim 11, further comprising:
- applying an adhesion promoter to said first substrate prior to said applying photosensitive benzocyclobutene to said first substrate to enhance said bond between said first substrate and said second substrate.

13. The method according to claim 11, further comprising:
- baking said photosensitive benzocyclobutene on said first substrate prior to said exposing at least a portion of said photosensitive benzocyclobutene to said predetermined wavelength of light.

14. The method according to claim 11, further comprising:
- baking said photosensitive benzocyclobutene on said first substrate following the said exposing at least a portion of said photosensitive benzocyclobutene to said predetermined wavelength of light to produce a reliable molecular cross-link at said bonding layer.

15. The method according to claim 11 wherein said applying photosensitive benzocyclobutene to said first substrate includes spinning said photosensitive benzocyclobutene upon said first substrate at a predetermined spin rate to achieve a predetermined thickness of said bonding layer.

16. The method according to claim 10 wherein said first substrate is a boron-doped silicon and said providing said first substrate having said first surface, said first surface having said first portion of said MEMS device formed thereon comprises:
- providing said first substrate;
- deep reactive ion etching a plurality of perforations through said first surface of said first substrate; and
- wet tetramethyl ammonium hydroxide anisotropic etching said first substrate below said plurality of perforations to produce a generally uniform cavity within said first substrate such that said first surface layer generally spans said cavity and defines said first portion of said MEMS device.

17. The method according to claim 10 wherein said applying photosensitive benzocyclobutene to said first surface of said first substrate in said predetermined pattern to define said bonding layer comprises:
- providing a stencil mask having an opening, a shape of said opening corresponding to said predetermined pattern;
- positioning said stencil mask adjacent said first surface of said first substrate; and
- applying photosensitive benzocyclobutene to said first surface of said first substrate through said opening of said stencil mask such that said photosensitive benzocyclobutene defines said bonding layer.

18. The method according to claim 10 wherein said second substrate is a boron-doped silicon and said providing said second substrate having said second surface, said second surface having said second portion of said MEMS device formed thereon comprises:
- thermally oxidizing said second substrate to form a silicon dioxide layer;
- depositing a silicon nitride layer, an oxide layer and a polycrystalline silicon layer upon said second substrate;
- boron doping said polycrystalline silicon layer to provide electrical conductivity; and
- etching said least one of said silicon nitride layer, said oxide layer, and said polycrystalline silicon layer to define said second portion of said MEMS device.

* * * * *

UNITED STATES PATENT AND TRADEMARK OFFICE
CERTIFICATE OF CORRECTION

PATENT NO.       : 6,942,750 B2                                      Page 1 of 1
APPLICATION NO.  : 10/163082
DATED            : September 13, 2005
INVENTOR(S)      : Tsung-Kuan A. Chou et al.

It is certified that error appears in the above-identified patent and that said Letters Patent is hereby corrected as shown below:

Column 5, line 54, after "is" insert --to--.

Figure 16A:
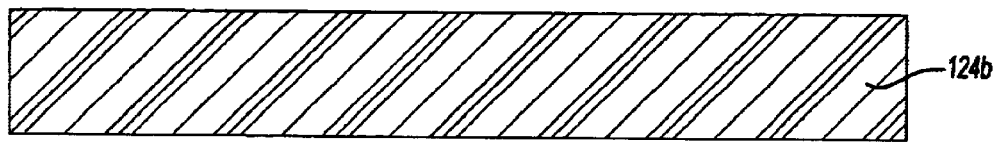
FIGS. 16(a)–(p) is a series of cross-sectional views illustrating the progressive processing steps for fabricating the MEMS device of FIG. 14.
Figure 16B:
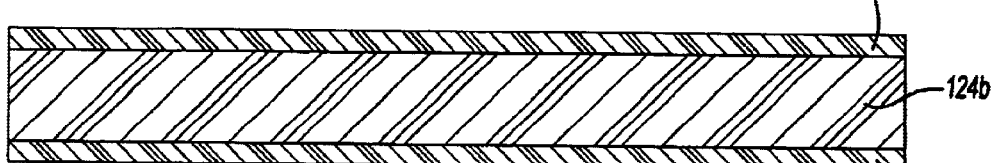
Figure 16C:
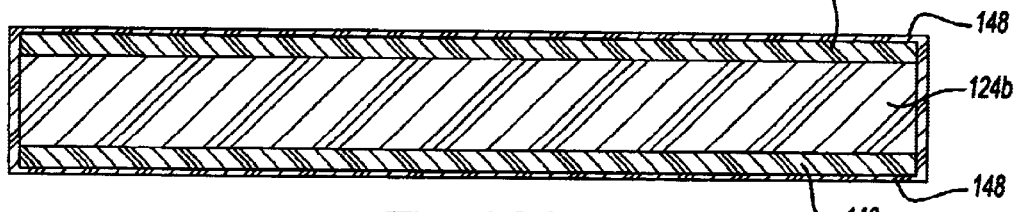
Figure 16D:
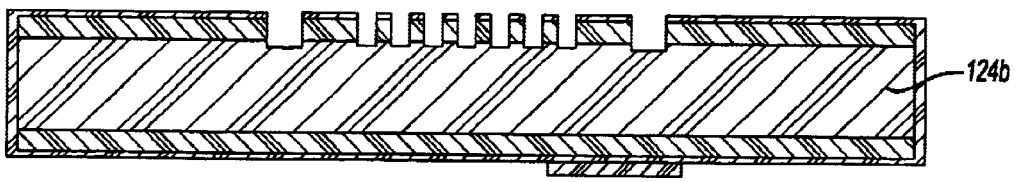
Figure 16E:
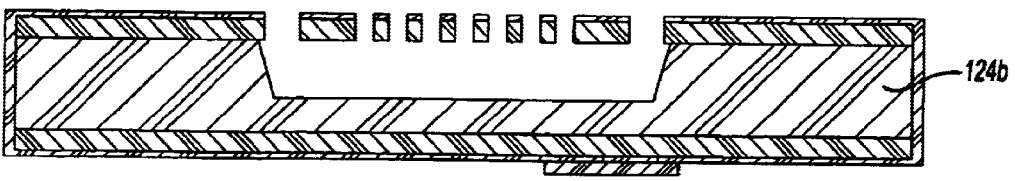
Figure 16F:
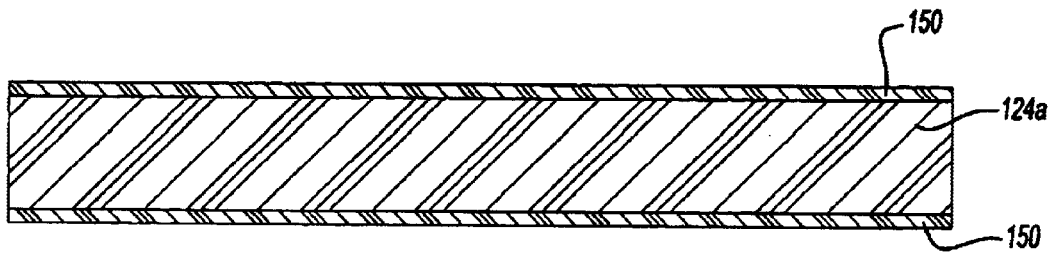
Figure 16G:
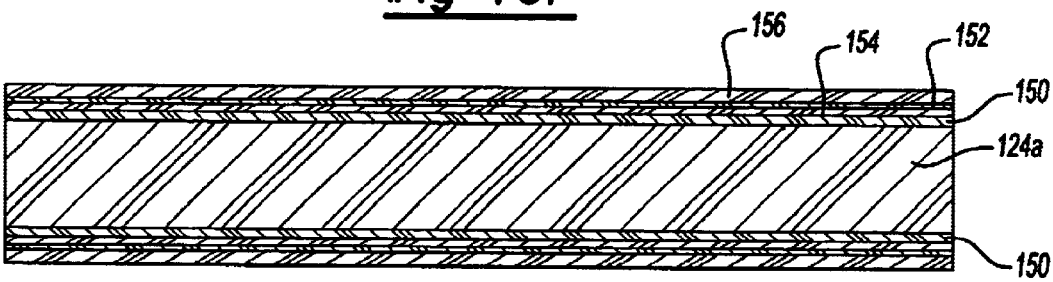
Figure 16H:
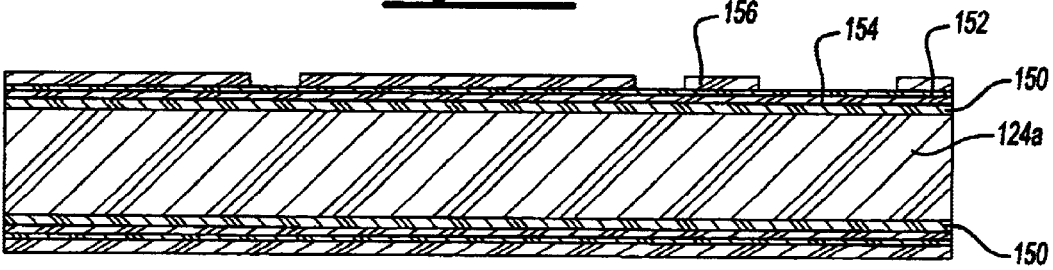
Figure 16I:
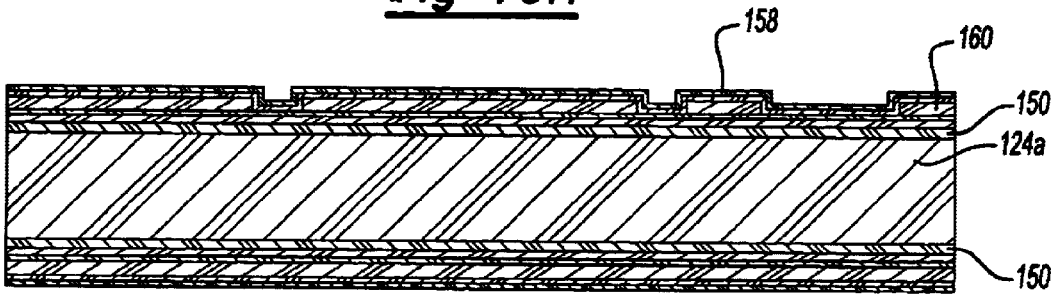
Figure 16J:
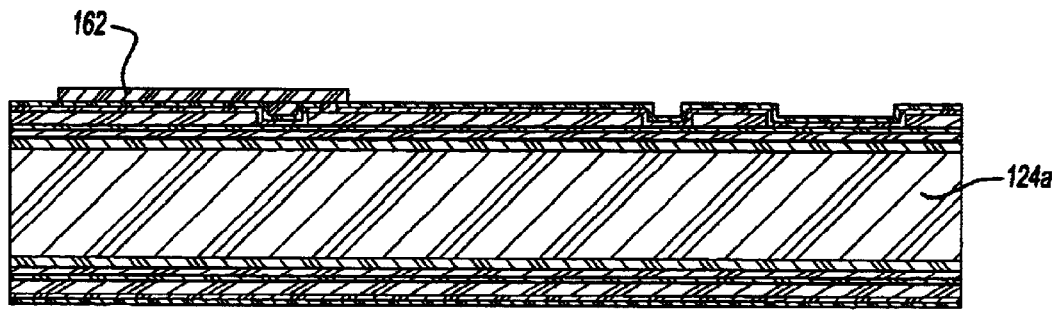
Figure 16K:
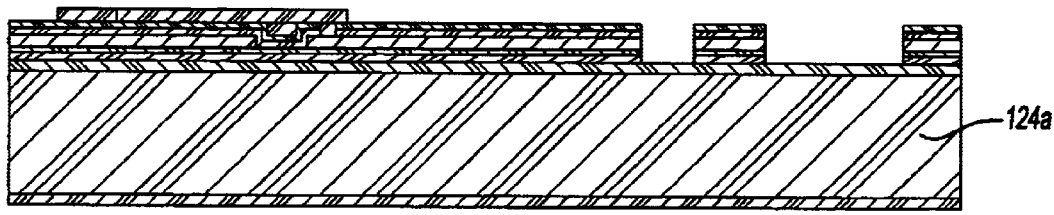
Figure 16L:
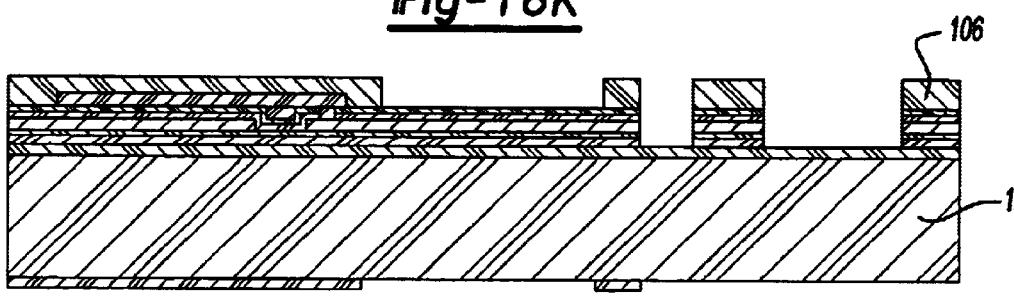
Figure 16M:
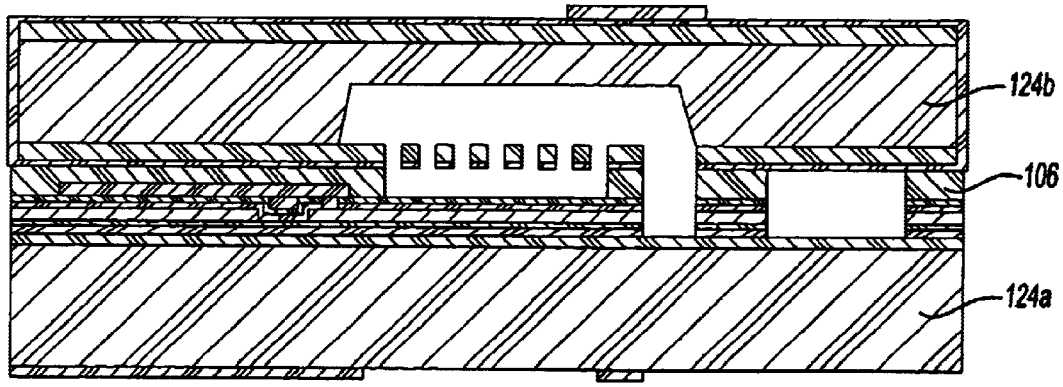
Figure 16N:
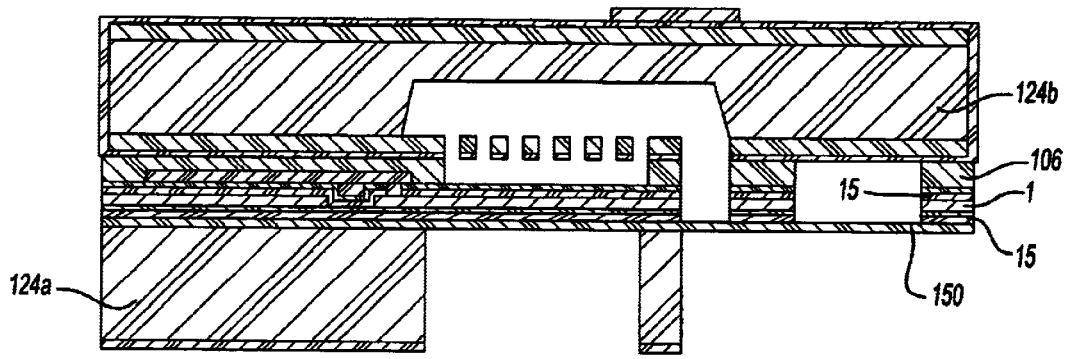

Column 8, line 37, delete "(FIG. 160))" and insert --(FIG. 16(j))--.

Figure 16O:
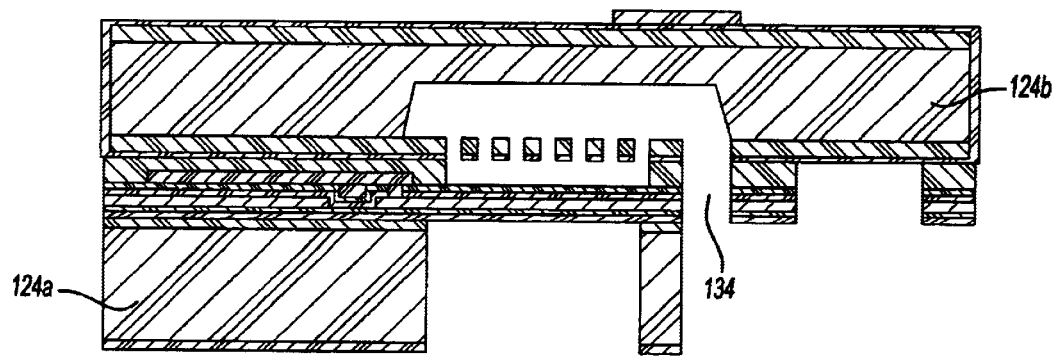

Column 8, line 58, delete "(FIG. 16o)" and insert --(FIG. 16(o))--.

Figure 16P:
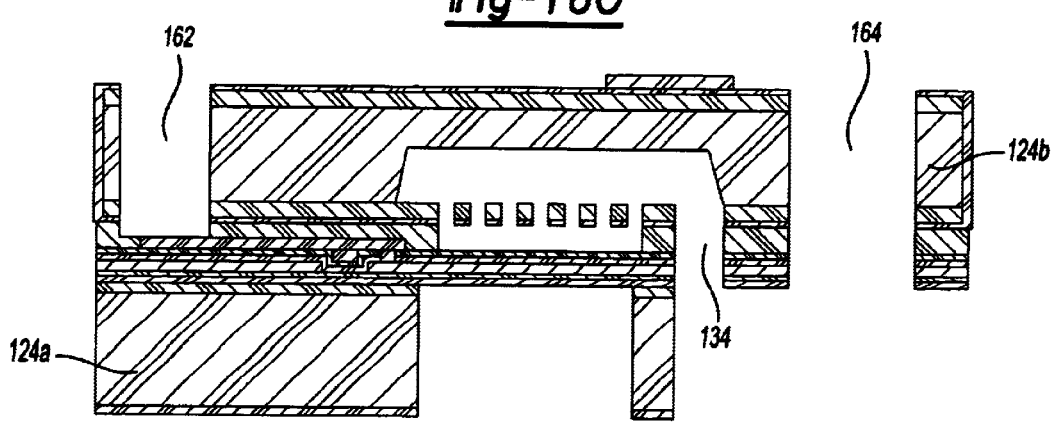

Column 8, line 60, delete "(FIG. 16p)" and insert --(FIG. 16(p))--.

Column 8, line 63, after "possible" insert --that--.

Column 9, line 31, claim 1, delete "50°C" and insert --150°C--.

Column 10, line 7, claim 7, after "said" (1st occurrence) insert --step of--.

Column 10, line 43, claim 9, after "said" insert --at--.

Signed and Sealed this

Sixth Day of March, 2007

JON W. DUDAS
*Director of the United States Patent and Trademark Office*